United States Patent [19]

Müeller et al.

[11] Patent Number: 4,902,136

[45] Date of Patent: Feb. 20, 1990

[54] ARRANGEMENT FOR HIGH-RESOLUTION SPECTROSCOPY

[75] Inventors: Rudolf Müeller, Soecking; Wolfgang Albertshofer, Geltendorf, both of Fed. Rep. of Germany

[73] Assignee: Siemens Aktiengesellschaft, Berlin and Munich, Fed. Rep. of Germany

[21] Appl. No.: 261,489

[22] Filed: Oct. 24, 1988

[30] Foreign Application Priority Data

Oct. 26, 1987 [DE] Fed. Rep. of Germany ....... 3736204
Dec. 18, 1987 [DE] Fed. Rep. of Germany ....... 3743131

[51] Int. Cl.$^4$ .............................................. G01J 3/51
[52] U.S. Cl. .................................... 356/419; 250/226; 356/416
[58] Field of Search ....................... 356/416, 419, 402; 250/226

[56] References Cited

U.S. PATENT DOCUMENTS 4,492,434 1/1985 Bottka et al. ......................... 350/356

FOREIGN PATENT DOCUMENTS 2108760 5/1983 United Kingdom .

OTHER PUBLICATIONS

R. F. Wolffenbuttel, "Photodiodes in Silicon with an Intrinsic Colour Filtering Capability", Proceedings of the International Conference on Solid State Sensors and Actuators–Transducers '87, Tokyo, 1987, pp. 219–222.
Fumio Koike et al., "A New Type Amorphous Silicon Full Color Sensor", Proceedings of the International Conference on Solid State Sensors and Actuators–Transducers '87, Tokyo, 1987, pp. 223–226.
W. Albertshofer et al., "The Use of an Integrated Array of Photo Diodes as a Spectrophotometer:, Proceedings of Sensoren-Technologie und Anwendung", Bad Nauheim, FRG, 1986, NTG-Fachberichte 93, 2 pages.
A. Piotrowski, "Design of Graded Bandgap Photodiode-Arrays for Spectrometric Use", dissertation, Monday Sep. 13, 1976, Technische Universitat Munchen, p. 48, Lehrstuhl fur Technische Elektronik.
Catalog "Optics & Filters", vol. III, p. 19, Oriel, 250 Long Beach Blvd., P.O. Box 872, Stratford, CT, U.S.A. 06497-0872.
Patent Abstracts of Japan, vol. 9, No. 37 (P-335) [1760] Feb. 16, 1985, Color Image Sensor Device.
Patent Abstracts of Japan, vol. 6, No. 217 (P-152 [1095] Oct. 30, 1982, Photodetector Having Wavelength Discriminating Function.
Patent Abstracts of Japan, vol. 6, No. 108, (P-123) [986] Jun. 13, 1982, Spectroscopic Measuring Method.

Primary Examiner—F. L. Evans
Attorney, Agent, or Firm—Hill, Van Santen, Steadman & Simpson

[57] ABSTRACT

An arrangement for high resolution spectroscopy includes a spatially or chronologically tunable interference filter with a wavelength selective diode array composed of a plurality of diode elements arranged side-by-side.

15 Claims, 5 Drawing Sheets

FIG 3
FIG. 3 a)
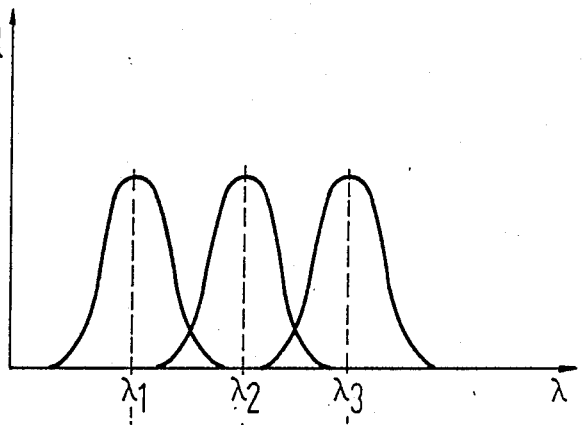
FIG. 3b)
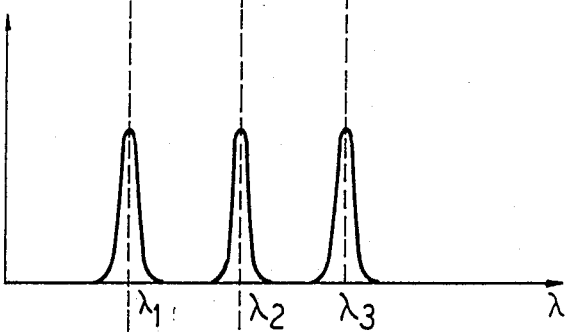
FIG. 3c)
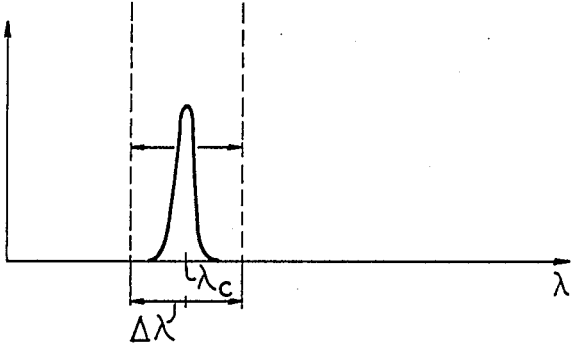

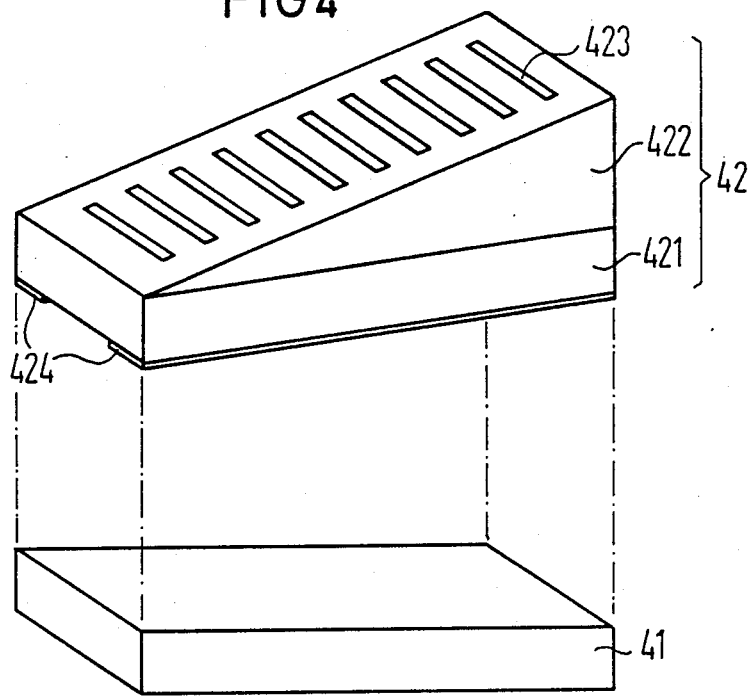
FIG 4
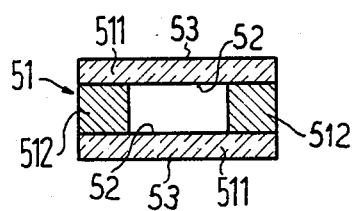
FIG 5
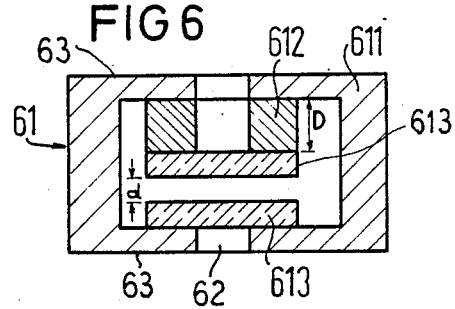
FIG 6

ARRANGEMENT FOR HIGH-RESOLUTION SPECTROSCOPY

BACKGROUND OF THE INVENTION

1. Field of the Invention

The present invention is directed generally to an arrangement for high-resolution spectroscopy including a wavelength selective diode array having different spectral sensitivities.

2. Description of the Related Art

Spectroscopic methods and analysis play a significant role in the fields of physics and chemistry. It is desirable in many applications to have a handy, compact spectrometer with which to perform spectroscopic analysis.

It is known to use photodiodes having "integrated" color filters as a spectrometer. See, for example, the publication of R. F. Wolffenbuttel, "Photodiodes in Silicon with an Intrinsic Color Filtering Capability", *Proceedings of the International Conference on Solid State Sensors and Actuators—Transducers* 87, Tokyo, pages 219–222, (1987) and F. Koike et al., "A New Type Amorphous Silicon Full Color Sensor", *Proceedings of the International Conference on Solid State Sensors and Actuators—Transducers* 87, Tokyo, pages 223–226 (1987). The disclosed devices utilize the fact that the penetration depth of optical radiation through silicon is wavelength dependent. The capture region for charge carriers and, thus, the entire wavelength-dependency of the photo current is controlled by the inhibit voltage applied to the diode. The disclosed photodiode is operated so that it has three color-sensitivity regions.

A publication of W. Albertshofer et al., "Flussigkeitsanalyse unter Verwendung einer Spektrometerdiode", *Proceedings of Sensoren-Technologie und Anwendung*, Bad Nauheim, FRG, 1986, NTG-Fachberichte 93, appendix page 30, discloses what is referred to as a spectrometer diode. The spectrometer diode is an arrangement of photodiodes which are side-by-side and which are sensitive in different wavelength regions. The diode is formed as a layered structure of a semiconductor material having continuously variable band spacing. The diode is irradiated from the side having the higher band spacing. Photons penetrate into the semiconductor material down to a depth in which they can be absorbed as a consequence of the band spacing. By beveling the backside of diode, it is possible to attach Schottky contacts at locations of different band spacing so that signals at corresponding different wavelengths can be received at the Schottky contacts.

The known diodes exhibit a resolution which is too low for many applications.

SUMMARY OF THE INVENTION

An object of the present invention is to provide improved resolution in an arrangement for spectroscopy in comparison to the prior art devices.

This and other objects are inventively achieved in a wavelength selective diode array having diode elements of different spectral sensitivity arranged side-by-side and further including an interference filter to improve resolution wherein the spacing of the transmission regions of the interference filter corresponds to the spacing of the sensitivity maxima of the individual diode elements. The interference filter is tunable so that it can cover the entire wavelength region of the diode array.

Further developments and advantages of the present invention are realized in a diode array formed of a semiconductor layer structure wherein the structure includes a layer sequence having continuously variable band spacing and every layer of the semiconductor layer structure is provided with at least one Schottky contact for conducting signals. The surface of the layer structure is beveled relative to the layer sequence and the contacts of the layers are arranged on the beveled plane. In one embodiment, the diode array includes a layer sequence composed of $GaAs_{1-p}P_p$ wherein p lies between 0 and 0.4, inclusive. A further improvement includes forming the interference filter as a wedge shape and arranging it relative to the diode array so that it lies between the light source and the diode array and so that the inclined surface of the wedge lies in the beam path. The slant of the wedge proceeds in the direction generally perpendicular to the slant of the sloping plane of the diode array. The contacts on the sloping plane are arranged in a two dimensional field whose axial directions coincide with the direction of the slope of the wedge and with the direction of the slope of the sloping plane of the diode array.

In a further development, the interference filter is plane parallel and is electro-mechanically tunable. This development may include a yoke for the plane parallel interference filter with a pair of plane parallel plates and a spacer formed of a piezoelectric crystal arranged in the yoke so that the thickness of the interference filter is tunable by the spacer. Alternately, the interference filter may contain at least one piezoelectric crystal.

In a further embodiment, the interference filter is plane parallel and is thermally tunable. This embodiment may include a spacer which, together with the interference filter, is arranged in a yoke composed of a material having a low coefficient of thermal expansion. The thickness of the interference filter is then variable on the basis of the thermal expansion of the spacer.

Another alternate combination includes an electrically tunable, plane parallel interference filter, wherein the interference filter may be composed of electrically birefringent material.

The diode array may be integrated with the interference filter in some embodiments. Furthermore, when an embodiment of the interference filter containing one piezoelectric tuning is used, two piezoelectric crystals may be provided, along with a plane parallel plate composed of a dielectric material. The piezoelectric crystals and the plane parallel plate are arranged in a mount so that the angle of inclination of the plane parallel plate is adjustable by electrical tuning of the length of the piezoelectric crystals. The plane parallel plate arranged between the diode array and the light source is transirradiated by the light. A further improvement of this embodiment includes the piezoelectric crystals secured to two opposite sides of the plane parallel plate so that the length variations of the piezoelectric crystals occur perpendicular relative to the surface of the plane parallel plate and so that the piezoelectric crystals are arranged along two parallel straight lines which do not coincide. The side of the piezo crystals facing away from the plane parallel plate are rigidly joined to the mount which is so rigid that a length variation of the piezoelectric crystals leads to a variation of the angle of inclination of the plane parallel plate.

The arrangement of the invention is for use in high resolution spectroscopy and contains a wavelength selective diode array which is composed of a semiconductor material and contains a spatially or chronologically tunable interference filter. It is especially advantageous to construct the wavelength selective diode array as an integrated module together with a tunable interference filter.

The resolution which is achievable with a semiconductor diode is limited by the fundamental mechanisms in the semiconductor. The fundamental limitation is a value of approximately 20 nanometers according to A. Piotrowski from the publication "Entwurf optimaler Spketrometerdioden", Dissertation, Technical University of Munich, Lehrstuhl fuer technische Elektronik, 1976. This resolution limitation can be far exceeded with an interference filter. Interference filters have a number of distinct transmission maximums. For the combination of a wavelength selective diode array with an interference filter, the elements are to be matched to one another so that the spacing of two interference maximums corresponds to the sensitivity maximums of two diode elements contained in the diode array. The resolution is, thus, optimized by arranging the interference filter and the diode array in succession. To cover the entire sensitivity region of the diode array, respective transmission regions of the interference filter are tuned between two adjacent sensitivity maximums of the diode elements.

By integrating the interference filter with the diode array, an extremely compact structure is possible.

BRIEF DESCRIPTION OF THE DRAWINGS

FIG. 3a is a graph showing, in greater detail, the wavelength sensitivity of diode elements;

FIG. 3b is a graph showing interference maximums of an interference filter relative to the wavelength sensitivity of FIG. 3a;

FIG. 3c is a graph showing the range over which an interference maximum of an interference filter can be tuned relative to the interference maximums of FIG. 3b;

FIG. 4 is a perspective view of an arrangement for high resolution spectroscopy including a wavelength selective diode array and a plane parallel interference filter according to the present invention;

FIG. 5 is a cross section of a plane parallel interference filter containing piezoelectric crystals to permit electro-mechanical tuning;

FIG. 6 is a cross section of a further embodiment of a plane parallel interference filter which is electro-mechanically or thermally tunable;

DESCRIPTION OF THE PREFERRED EMBODIMENTS

Figure 1:
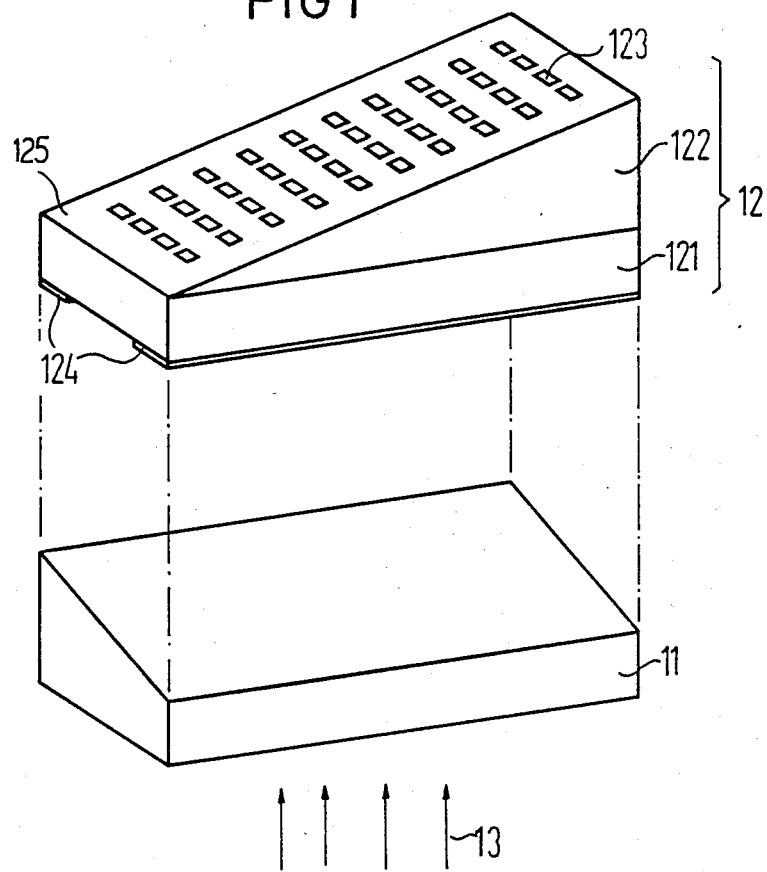
FIG. 1 is a perspective view showing an arrangement for high resolution spectroscopy including a wavelength selective diode array and a wedge shaped interference filter in accordance with the principles of the present invention.

In an arrangement according to the present invention as shown in FIG. 1, a wedge-shaped interference filter 11 is included which is composed of a material transmissive for light to be investigated. A first diode array 12 is aligned with the interference filter 11 as shown by the broken lines. The diode array 12 is constructed on a first substrate 121 over which is applied a first layer structure 122. The first diode array 12 is composed of a semiconductor material. The band spacing of the semiconductor material steadily decreases in the direction perpendicular to the first layer structure 122 proceeding from the first substrate 121 for wavelength selectivity. The band spacing is greatest in the first substrate 121; and it is smallest at the end of the first layer structure 122 facing away from the first substrate 121.

A surface 125 of the first layer structure 122 that faces away from the first substrate 121 is beveled, or angled, and a plurality of first contacts 123 are applied to this beveled surface 125. The first contacts 123 are arranged in a two dimensional field which is laid out along the direction of the slope of the beveled surface and the direction perpendicular to the direction of the slope and parallel to the beveled surface.

The band spacing steadily changes in the direction of the slope of the beveled surface, so that two respective neighboring contacts see a different band spacing in this direction.

The first contacts 123 are preferably Schottky contacts that form, for example, inhibiting Schottky diodes. The first contacts 123 are composed, for example, of gold. A first ohmic contact 124 is provided on the side of the first substrate 121 which faces away from the first layer structure 122. The first ohmic contact 124 is provided with a recess, or opening, so that light, as indicated by first arrows 13, can penetrate through the first ohmic contact 124 into the first substrate 121. The first diode array 12, for example, is sensitive to light in the wavelength range of from 650 through 900 nanometers. In this example, the first substrate 121 and the first layer structure 122 are composed of $GaAs_{1-p}P_p$, wherein the mixing index p assumes the value of 0.4 in the first substrate 121 and the mixing index P assumes a value of between 0.4 and 0 in the first layer structure 122. The upper most layer of the first layer structure 122 is thus composed of GaAs.

Figure 2:
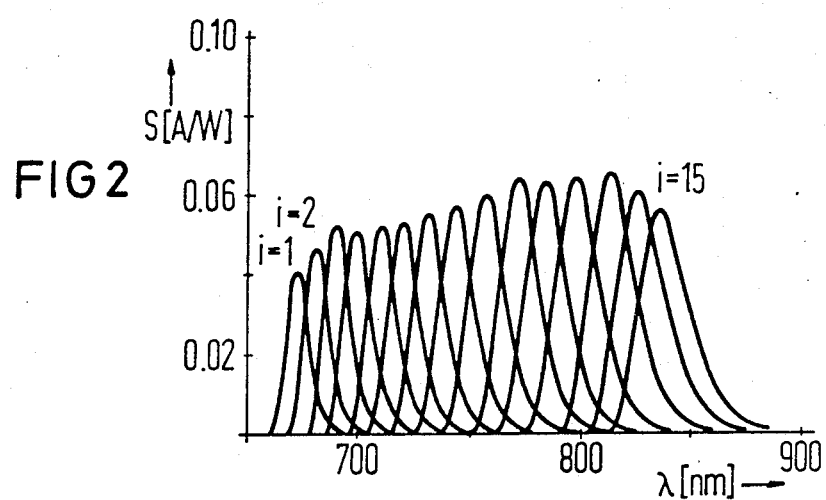
FIG. 2 is a graph showing the sensitivity of individual elements of a diode array as a function of wavelength.

The graph of FIG. 2 illustrates the sensitivities S (in Amperes per Watt) of the diode elements of the first diode array 12 as a function of wavelength $\lambda$ (in nanometers). Only fifteen curves i are shown for the sake of simplicity. The sensitivity curve i for i=1 through 15 of each and every individual diode element is approximately bell shaped. The sensitivities i of the individual diode elements partially overlap.

The wedge-shaped interference filter 11, referring again to FIG. 1, is arranged relative to the first diode array 12 so that the direction of the slope of the wedge-shaped interference filter 11 proceeds perpendicular to the direction of the slope of the beveled surface of the first diode array 12. The wedge-shaped interference filter 11 is arranged under the first substrate 121 so that the light of a specimen to be investigated, as indicated by the first arrows 13, first transirradiates the wedge-shaped interference filter 11 and then proceeds through the first substrate 121 into the first diode array 12. The light penetrates into the first layer structure 122 up to a depth until it has reached the layer having the band spacing corresponding to its wavelength. Given absorption of the penetrating light, charge carriers are generated in the layer structure which can be documented as signals appearing at corresponding ones of the first contacts 123. The first contacts 123 are arranged in a two dimensional field which is laid out in the direction of the slope of the wedge-shaped interference filter 11 and the direction of the slope of the beveled surface of the first layer structure 122.

The thickness and the slope of the wedge-shaped interference filter 11 is selected so that the spacing of the transmission regions of the wedge-shaped interference filter 11 corresponds to the spacings of the sensitivity maximums of the first diode array 12, as shown in FIG. 2, and so that the shift of every transmission region of the wedge-shaped interference filter 11 over the width of the wedge covers the region between the two sensitivity maximums of the first diode array 12. Thus, the wedge shape of the interference filter 11 causes shifts of transmission characteristics in the direction of the slope of the wedge so that one or more of the diodes in a row in the array can receive light-shifted to its sensitivity maximum.

The wedge-shaped interference filter 11 is composed, for example, of calcium fluoride, magnesium fluoride, or silicon monoxide. In one embodiment, the thickness of the wedge-shaped interference filter 11 amounts to, for example, 14 micrometers at the base of the slope and 14.2 micrometers at the apex of the slope, the slope being exaggerated for purposes of illustration in the figures. A refractive index of 1.5 is assumed which lies in the region of the refractive indexes of the materials used.

In FIG. 3a is shown the relative sensitivity curves for three individual diode elements. The sensitivity curves each have a bell shape with maximums at wavelengths $\lambda_1$, $\lambda_2$ and $\lambda_3$. The sensitivity curves of the three diodes partially overlap.

FIG. 3b shows the luminous intensity I for a transmission region of an interference filter which likewise has maximums at the wavelengths $\lambda_1$, $\lambda_2$, and $\lambda_3$. The interference filter is selected so that the luminous intensity maximums coincide with the sensitivity maximums of the three diode elements as shown in FIG. 3a.

In FIG. 3c, a region $\Delta\lambda$ over which the position, or center wavelength $\lambda_c$, of a transmission region of the interference filter is capable of being tuned or swept is shown. This tuning can occur spatially, for example, with a wedge shaped interference filter as shown in FIG. 1. It is also possible to provide tuning on the basis of chronological separation as in the case of, for example, thermal or electrical tuning of a plane parallel interference filter.

When the light is incident along the vertical direction, an interference filter having a thickness d allows wavelengths of light to pass when the light wavelength $\lambda$ meets the condition $\lambda = (2d)/Z \cdot n$, wherein n is the refractive index of the interference filter and Z is a natural number. The optical length of the filter can be varied by varying the thickness d or by varying the refractive index n so that the wavelength allowed to pass thereby also varies.

In FIG. 4 is shown a first plane parallel interference filter 41 in place of a wedge shaped filter as in FIG. 1, the filter 41 being composed of a material which is transmissive for the light to be investigated. FIG. 4 also shows a second diode array 42. Like the first diode array 12, the second diode array 42 is constructed on a second substrate 421. The second substrate 421 is followed by a second layer structure 422 including second electrical contacts 423. The second diode array 42 is made of a semiconductor material having a variable band spacing. The band spacing is greatest in the second substrate 421 and decreases across the second layer structure 422. The surface of the second layer structure 422 which faces away from the second substrate 421 is beveled and the second contacts 423 are applied to the beveled surface. One second contact 423 is provided per layer of the second layer structure 422 rather than a row of several contacts as in the above described embodiment. The second contacts 423 are likewise Schottky contacts. A second ohmic contact 424 is provided on the side of the second substrate 421 facing away from the second layer structure 422. The second ohmic contact 424 is provided with an opening or recess so that light, as indicated by second arrows 43, can penetrate through the second ohmic contact 424 to the second substrate 421.

The first plane parallel interference filter 41 is exposed to chronologically variable, external influences and is thereby chronologically tuned. Chronological resolution of the signals sensed at the second contacts 423 make it possible to improve the resolution achieved by tuning of the first plane parallel interference filter 41 with only one second contact 423 per layer of the second layer structure 422.

The first plane parallel interference filter 41 is arranged relative to the second diode array 42 so that light of a specimen to be investigated, as indicated by the second arrows 43, first transirradiates the first plane parallel interference filter 41 and proceeds through the second substrate 421 and into the second diode array 42 where it is analyzed, as set forth above.

It is possible to tune the plane parallel interference filter 41 by external influences such as, for example, by thermal, electro-mechanical, magneto-strictec, or electrical means. In one embodiment, the plane parallel interference filter 41, for example, is formed of a piezoelectric crystal which is transmissive for light to be investigated. By applying an electrical voltage, the thickness of the interference filter is changed. As a result thereof, the wavelength which is allowed to pass through the interference filter 41 also changes.

In another embodiment, the plane parallel interference filter 41, for example, is manufactured of an electrically birefringent material, for example, of gallium arsenide. The wavelength that the plane parallel interference filter 41 allows to pass can also be influenced in this case by applying a voltage thereto.

Tuning of the interference filter can occur either slowly such as by nearly stationary tuning or by fast sweeping. Alternating current test methods, such as for example lock-in techniques, can thereby be employed. What is referred to as a half wave voltage is required for tuning from one transmission region to the next, the halfway voltage usually amounting to a few kV for most materials.

In FIG. 5 is shown a cross section view of a further exemplary embodiment of a second plane parallel interference filter 51 which contains piezoelectric crystals 512. The second plane parallel interference filter 51 contains two first transparent plates 511 which are arranged plane parallel to one another and the first plates 511 are joined to one another by webs or spacing members 512. One of the plane parallel surfaces 53 of each of the two first plates 511 is bloomed, or coated, and the other surface 52 is partially mirrored. This causes an interference of light which is reflected at the partially mirrored surfaces. The spacing members 512 are composed, for example, of piezoelectric crystals so that it is possible to influence the spacing between the first plates 511, and thus the mirrored surfaces 52, by applying an electrical voltage to the ridges 512. With this embodiment, the second plane parallel interference filter 51 is electro-mechanically tuned for different wavelengths. It is, of course, possible that different surfaces can be partially mirrored than those shown in the FIG. 5.

Alternately, the embodiment of FIG. 5 can have the webs 512 composed of, for example, a material which exhibits magnetostriction. By magnetizing the ridges 512, their lengths are varied. The distance between the two first plates 511 can thus be changed.

FIG. 6 shows a further embodiment including a third plane parallel interference filter 61 which includes a yoke 611. The yoke 611 is cylindrical and comprises a circular opening 62 through both base plates 63. The yoke 611 contains two second transparent plates 613 arranged parallel to one another. One of the second plates 613 is secured to one of the base plates 63 inside the yoke 611. One of the plane parallel surfaces of each of the two second plates 613 is bloomed or coated and the other surface is partially mirrored. The third plane parallel interference filter 61 uses the interference of light which is reflected at the partially mirrored surfaces. The other second transparent plate 613 is secured to the other base plate 63 in the yoke 611 via a spacer 612. The spacer 612, for example, is annular in shape. By varying the thickness of the spacer 612, the distance between the plane parallel second plates 613 can be varied. It is possible to electro-mechanically influence the thickness of the spacer 612, for example, when the spacer 612 is fabricated of a piezoelectric crystal and a voltage is applied thereto. Since one of the second plates 613 is rigidly connected to the spacer 612, the distance between the plane parallel second plates 613 thereby varies.

A further possibility to vary the thickness of the spacer 612 is to utilize thermal expansion of the spacer 612. By heating the spacer 612 and particularly when simultaneously cooling the yoke 611, only the thickness of the spacer 612 changes and thus the distance between the plane parallel second plates 613 change. In instances where cooling of the yoke 611 is impossible or to involved, it is beneficial to fabricate the yoke 611 of a material having a low coefficient of thermal expansion, for example, of the material Invar.

Since the thickness of the spacer 612 is selected to be larger than the thickness of the spacer members 512 in the embodiment of FIG. 5, a greater change in spacing between the second plate 613 is achieved by heating the spacer 612 than would be possible by heating the webs 512 in the preceding embodiment.

In an exemplary embodiment, a spacing d is present between the second plates 613 which amounts to, for example, 14 micrometers and the spacing variation possible amounts to 0.2 micrometers. The spacer 612 has a thickness D of, for example, 280 micrometers so that $D = k_1 \cdot d$ where $k_1 = 20$. The $k_1^{th}$ fraction of the temperature change $\Delta T$ that would be required for a plate having a thickness d thus suffices for the expansion of spacer 612 by 0.2 $\mu$m, in other words $\Delta T_1 = \Delta T_1/k_1$. When the spacer 612 is, for example, of glass, to expand it by 0.2 $\mu$m, a temperature change $\Delta T$ of about 80 degrees celsius is required.

Since the spacing of the first plates 511 and FIG. 5 also amounts to, for example, approximately 14 $\mu$m and the variation in spacing amounts to 0.2 $\mu$m, heating of the webs 512 by a temperature $\Delta T = k_1 \cdot \Delta T_1$ would be required. This would correspond to a difference in temperature of approximately 1600 degrees celsius for glass.

Figure 7:
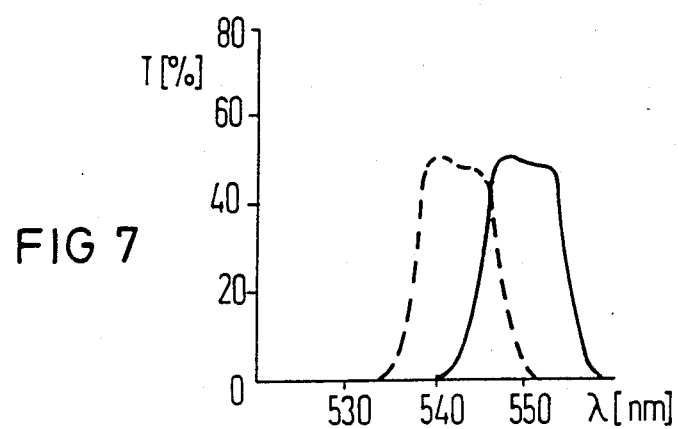
FIG. 7 is a graph showing a transmission curve of a dielectric plane parallel plate for perpendicular light incidence (in solid line) and for light incident at an angle of 20 degrees from vertical (in broken line)
Figure 8:
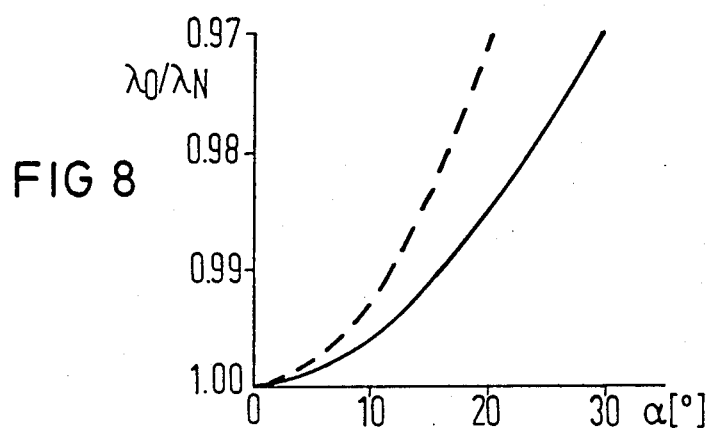
FIG. 8 is a graph showing the relative wavelength shift depending on the tilt angle for vertical light incidence for a plane parallel dielectric plate having an effective refractive index of 2.0 (in solid line) and an effective refractive index of 1.45 (in broken line)

The transmission characteristic of a plane parallel plate that is composed of a dielectric material, for example, of ZnS or cryolite, is dependent upon the angle of incidence of the optical radiation. A plane parallel plate having a thickness d allows wavelengths of light to pass when the wavelength $\lambda$ satisfies the condition $\lambda = (2nd)/Z \cdot \cos \alpha$, where n is the refractive index of the dielectric, z is a natural number and $\alpha$ is the internal angle of incidence of the light. This effect is illustrated in FIGS. 7 and 8 which are taken from the Oriel, Optical Filters catalog. FIG. 7 shows the percent of transmission T through a plane parallel plate as a function of the wavelength $\lambda$ for two different angles of incidence. The refractive index of the plane parallel plate amounts to 2.0. The solid line curve shows the transmission characteristic for vertical incidence of light wherein the angle of incidence $\alpha = 0$ degrees. The broken line curve shows the transmission characteristic through a plane parallel plate for an angle of incidence of 20 degrees. It can be clearly seen that a shift in the mean transmitted wavelength $\lambda$ occurs with a change in the angle of incidence.

FIG. 8 is a graph showing the relationship of the transmitted wavelength at the angle of incidence 0 degrees relative to the transmitted wavelength at a different angle of incidence as a function of the angle of incidence for different refractive indexes of the plane parallel plate. The relative wavelength variation for a refractive index of 2.0 is shown as a solid line curve and the relative wavelength variation for a refractive index of 1.45 is shown as a broken line curve. It can be derived from the broken line curve that for a material of refractive index of 1.45, a change in the angle of incidence from 0 degrees to 20 degrees varies the wavelength by 3%. For a transmitted wavelength of 7 nanometers, this results in a shift of 21 nanometers. The shift is less for the material of refractive index of 2.0 for the same change in angle of incidence.

Figure 9:
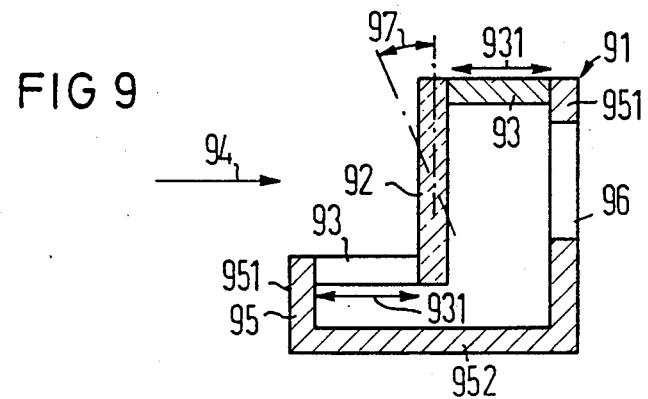
FIG. 9 is an end elevational view of a schematic diagram of an interference filter including a dielectric plane parallel plate which is tiltable with the assistance of two piezoelectric crystals according to the present invention.

A fourth embodiment of a plane parallel interference filter 91 is shown in FIG. 9 in which the fourth plane parallel interference filter 91 includes a dielectric plane parallel plate 92 as well as two piezoelectric crystals 93. The piezoelectric crystals are rigidly connected to the dielectric plane parallel plate 92 and are preferably each of a rod shape. The smaller side or end of each of the piezoelectric crystals 93 is connected to the dielectric plane parallel plate 92 at opposite surfaces of the plate and perpendicular thereto. Light, as indicated by a directional arrow 94, transirradiates the surfaces to which the piezoelectric crystals 93 are attached and passes through the dielectric plane parallel plate 92. The longitudinal axes of the piezoelectric crystals 93 are arranged so that they lie along parallel non-coincident straight lines. The ends or sides of piezo-crystals 93 which face away from the dielectric plane parallel plate 92 are rigidly connected to a mount 95, the mount 95 including two vertical plates 951 which are rigidly connected to one another by a horizontal part 952. The vertical parts 951 are of different heights. The height difference of the vertical part 951 is of a size so that the piezocrystals 93 which are rigidly connected to the dielectric plane parallel plate 92 are also rigidly connected at the upper edge of each of the vertical parts 951. Thus, the height difference of the vertical parts 951 roughly corresponds to the spacing of the fastening points of the piezo-crystals 93 on the dielectric plane parallel plate 92. Since the piezo-crystals 93 are rigidly connected to the dielectric plane parallel plate 92 and to the vertical parts 951 of the rigid mount 95, any length variation of the piezo-crystals 93 in the direction indicated by the length variation arrow 931 leads to tilting or angling of the dielectric plane parallel plate 92 by an angle 97. The lengthening by the piezo-crystals 93 produces a torque which acts on the dielectric plane parallel plate 92. Since light impinges the dielectric plane parallel plate 92 from a fixed direction which is indicated by the directional arrow 94, the incident angle of the light on the dielectric plane parallel plate 92 is varied by changing the angle 97. Thus according to the comments set forth above relative to FIGS. 7 and 8, the transmitted wavelength changes as the angle of incidence changes. The longer one of the vertical parts 951 has an opening or recess 96 through which light, after passing through the dielectric parallel plate 92 proceeds to a diode array arranged behind the fourth plane parallel interference filter 91. The opening 96 is arranged so that light proceeds unimpeded onto the diode array after passing through the plate 92.

In one example, for a wavelength of 700 nanometers, a refractive index of 1.45, and an angle of incidence of 20 degrees, the transmitted wavelength is shifted by 21 nm. Since the sensitivity maximums of two diodes in the diode array has the spacing of about 20 nm, the fourth plane parallel interference filter is well suited for tuning the transmission region from one sensitivity maximum of the photo diode array to a neighboring sensitivity maximum by variation of the angle 97 between 0 and 20 degrees.

Although other modifications and changes may be suggested by those skilled in the art, it is the intention of the inventors to embody within the patent warranted hereon all changes and modifications as reasonably and properly come within the scope of their contribution to the art.

We claim:

1. An arrangement for high-resolution spectroscopy, comprising:
    a wavelength-selective diode array including diode elements arranged side-by-side, said diode elements having different spectral sensitivities;
    an interference filter having transmission regions corresponding to spacing of sensitivity maximums of individual ones of said diode elements, said interference filter being tunable to cover an entire wavelength region of said diode array to improve resolution.

2. An arrangement as claimed in claim 1, wherein said diode array is of a semiconductor layer structure having a layer sequence with continuously variable band spacing;
    at least one Schottky contact provided on every layer of said semiconductor layer structure for receiving signals.

3. An arrangement as claimed in claim 2, wherein said layer structure has a surface that is beveled relative to the layer sequence of said layer structure, said contacts being provided on said beveled surface.

4. An arrangement as claimed in claim 3, wherein said diode array is of a layer sequence consisting essentially of $GaA_{1-p}P_p$ wherein p is between 0 and 0.4, inclusive.

5. An arrangement as claimed in claim 3, wherein said interference filter is wedge shaped, said interference filter lying between a light source and said diode array, said inclined surface of said wedge lying in a beam path of said light source, said wedge-shaped interference filter having a slant proceeding in a direction perpendicular to a slant of a sloping plane of said diode array;
    said contacts on said sloping plane being arranged in a two-dimensional field having an axial direction coincident with a direction of the slope of said wedge and of the slope of said sloping plane.

6. An arrangement as claimed in claim 3, wherein said interference filter is plane-parallel and, further comprising:
    means for electro-mechanically tuning said interference filter.

7. An arrangement as claimed in claim 6, further comprising:
    a yoke for said interference filter;
    plane-parallel plates and a spacer, said spacer being of a piezoelectric crystal and being arranged with said plane parallel plates in said yoke to permit tuning of said interference filter.

8. An arrangement as claimed in claim 6, wherein said interference filter contains at least one piezoelectric crystal.

9. An arrangement as claimed in claim 3, wherein said interference filter is plane parallel and thermally tunable.

10. An arrangement as claimed in claim 9, further comprising:
    a spacer;
    a yoke of a material having a lower thermal expansion than said spacer, said spacer and said interference filter being arranged in said yoke so that a thickness of said interference filter is variable by thermal expansion of said spacer.

11. An arrangement as claimed in claim 3, wherein said interference filter is plane parallel and, further comprising:
    means for electrically tuning said interference filter.

12. An arrangement as claimed in claim 11, wherein said interference filter is of electrically birefringent material.

13. An arrangement as claimed in claim 1, wherein said diode array is integrated with said interference filter.

14. An arrangement as claimed in claim 8, further comprising:
    two piezoelectric crystals;
    a plane parallel plate of dielectric material;
    a mount holding said two piezoelectric crystals and said plane parallel plate so that an angle of inclination of said plane parallel plate is adjustable by electrical tuning of the length of said two piezoelectric crystals; and
    a plane parallel plate arranged between said diode array and said light source so that it is transirradiated by said light.

15. An arrangement as claimed in claim 14, wherein said two piezoelectric crystals are secured to two opposite sides of said plane parallel plate so that length variations of said two piezoelectric crystals are in a plane perpendicular to a surface of said plane parallel plate, said two piezoelectric crystals being arranged along two parallel straight non-coincident lines, said two piezoelectric crystals each having a side facing away from said plane parallel plate rigidly joined to said mount so that length variations of said two piezoelectric crystals cause variations of an angle of inclination of said plane parallel plate.

* * * * *